(12) United States Patent
Hashimoto et al.

(10) Patent No.: US 12,319,814 B2
(45) Date of Patent: Jun. 3, 2025

(54) POLYAMIDEIMIDE RESIN, RESIN COMPOSITION, AND SEMICONDUCTOR DEVICE

(71) Applicant: SHOWA DENKO MATERIALS CO., LTD., Tokyo (JP)

(72) Inventors: Gaku Hashimoto, Tokyo (JP); Daichi Takemori, Tokyo (JP); Eiichi Satoh, Tokyo (JP); Mizuki Sato, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 698 days.

(21) Appl. No.: 17/640,735

(22) PCT Filed: Aug. 31, 2020

(86) PCT No.: PCT/JP2020/032883
§ 371 (c)(1),
(2) Date: Mar. 4, 2022

(87) PCT Pub. No.: WO2021/045004
PCT Pub. Date: Mar. 11, 2021

(65) Prior Publication Data
US 2022/0332947 A1     Oct. 20, 2022

(30) Foreign Application Priority Data
Sep. 6, 2019 (JP) .................. 2019-163154

(51) Int. Cl.
C08L 79/08     (2006.01)
C08G 73/10     (2006.01)
(Continued)

(52) U.S. Cl.
CPC .......... *C08L 79/08* (2013.01); *C08G 73/1042* (2013.01); *C08G 73/106* (2013.01);
(Continued)

(58) Field of Classification Search
CPC .............................. C08G 73/106; C08G 73/14
See application file for complete search history.

(56) References Cited

U.S. PATENT DOCUMENTS

2018/0305498 A1* 10/2018 Chae ..................... C08J 5/18

FOREIGN PATENT DOCUMENTS

| CN | 1954015 A | 4/2007 |
|---|---|---|
| EP | 1739114 A1 | 1/2007 |

(Continued)

OTHER PUBLICATIONS

Chin-Ping Yang et al. Preparation and properties of cardo poly(amide-imide)s derived from 9,9-bis(4-aminophenyl) fluorene, trimellitic anhydride, and various aromatic diamines, Makromol. Chem. 193, "New poly(amide-imide) syntheses, 3a" pp. 445-453 (1992), XP 000260707, Feb. 1, 1992 (cited in a Search Report dated Aug. 7, 2024 in related European App. No. 22762777.5).

(Continued)

*Primary Examiner* — Marc S Zimmer
*Assistant Examiner* — Surbhi M Du
(74) *Attorney, Agent, or Firm* — FITCH, EVEN, TABIN & FLANNERY, LLP

(57) ABSTRACT

A polyamideimide resin containing a structural unit (Ia) represented by a formula shown below, and a structural unit (IIa) represented by a formula shown below. In the formula (Ia), each X independently represents a hydrogen atom, or at least one substituent selected from the group consisting of halogen atoms, alkyl groups of 1 to 9 carbon, atoms, and alkoxy groups and hydroxyalkyl groups of 1 to 9 carbon atoms. In the formula (IIa), each R independently represents a hydrogen atom, or at least one substituent selected from the group consisting of alkyl groups of 1 to 9 carbon atoms, alkoxy groups of 1 to 9 carbon atoms and halogen atoms, and n represents an integer of 1 to 6.

(Continued)

(Ia)

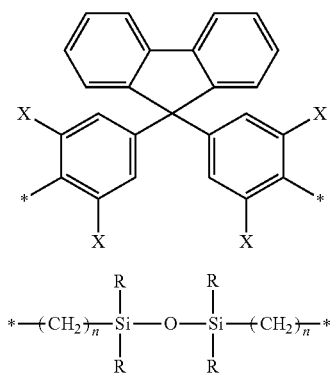

(IIa)

(56) References Cited

FOREIGN PATENT DOCUMENTS

| EP | 4026867 A1 | 7/2022 | | |
|---|---|---|---|---|
| JP | S63-295633 A | 12/1988 | | |
| JP | 2000-143802 A | 5/2000 | | |
| JP | 2005-146118 A | 6/2005 | | |
| JP | 2007-077308 A | 3/2007 | | |
| JP | 2007-137933 A | 6/2007 | | |
| JP | 2008-074991 A | 4/2008 | | |
| JP | 2008-307737 A | 12/2008 | | |
| JP | 2013-135061 A | 7/2013 | | |
| JP | 2018-522105 A | 8/2018 | | |
| JP | 2019105829 A | * | 6/2019 | ............ B32B 27/08 |
| JP | 2020-007531 A | 1/2020 | | |
| JP | 6996643 B2 | 1/2022 | | |
| WO | 2019/123562 A1 | 6/2019 | | |

OTHER PUBLICATIONS

Zhigiang Hu et al., "Synthesis and Properties of Polyamide-imides Containing Fluorenyl Cardo Structure" Journal of Applied Polymer Science, vol. 106, (2007) pp. 2494-2501 Nov. 15, 2007 (cited in a Search Report dated Aug. 7, 2024 in related European App. No. 22762777.5).

Ewa Schab-Balcerzak et al. "Novel soluble aromatic poly(amideimide)s containing 9,9-diphenylfluorene moieties: characterization and optical properties" Central European Journal of Chemistry, pp. 604-619, 2006, Dec. 1, 2006 (cited in a Search Report dated Aug. 7, 2024 in related European App. No. 22762777.5).

E.I. Lozinskaya et al. "Direct polycondensation in ionic liquids" Elsevier, European Polymer Journal 40 (2004), pp. 2065-2075 Sep. 1, 2004 (cited in a Search Report dated Aug. 7, 2024 in related European App. No. 22762777.5).

* cited by examiner

8 Claims, 1 Drawing Sheet

(51) Int. Cl.
  *C08G 73/14* (2006.01)
  *C09D 179/08* (2006.01)
  *H01L 23/29* (2006.01)
  *H01L 23/31* (2006.01)

(52) U.S. Cl.
  CPC ........... *C08G 73/14* (2013.01); *C09D 179/08* (2013.01); *H01L 23/293* (2013.01); *H01L 23/296* (2013.01); *H01L 23/3135* (2013.01); *H01L 2924/181* (2013.01)

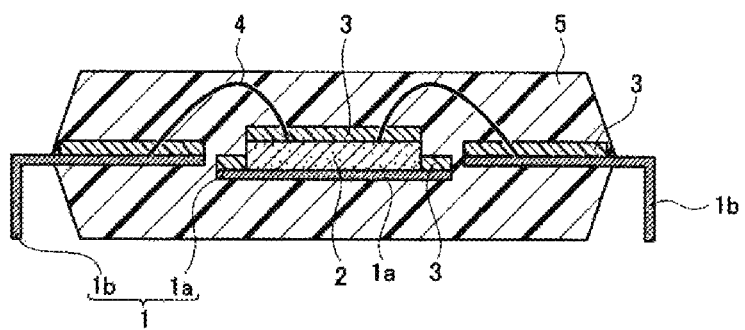

POLYAMIDEIMIDE RESIN, RESIN COMPOSITION, AND SEMICONDUCTOR DEVICE

CROSS-REFERENCE TO RELATED APPLICATIONS

This application is a U.S. national phase application filed under 35 U.S.C. § 371 of International Application No. PCT/JP2020/032883, filed Aug. 31, 2020, designating the United States, which claims priority from Japanese Application No. 2019-163154, filed Sep. 6, 2019, which are hereby incorporated herein by reference in their entirety.

TECHNICAL FIELD

One embodiment of the present invention relates to a polyamideimide resin containing a cardo structure fluorene skeleton. Further, other embodiments of the present invention relate to a resin composition containing the polyamideimide resin, and a semiconductor device that uses the resin composition.

BACKGROUND ART

The carbon dioxide ($CO_2$) discharged from all manner of industrial equipment and the like is one of the main causes of global warming. Accordingly, development of a low-carbon society is required to address this problem of global warming. An example of one method of realizing such a low-carbon society involves using power semiconductors in industrial equipment to reduce power loss. Power semiconductors can be applied to a variety of applications such as automobiles, and demand continues to increase. Examples of power semiconductors designed for automobiles include power cards, and TO, SOP, QFP, BGA and CSP packages.

In recent years, particularly as a result of the electrification of vehicles (EV), the power density of power semiconductors has continued to increase, and the device drive temperature (Tj) has also increased. As a result, the temperature demands during heat cycle testing have also continued to increase.

However, conventional power semiconductors can sometimes suffer from detachment between component members, such as at the interface between the resin sealing layer and the substrate or the semiconductor element, in heat cycle testing that assumes a higher drive temperature (increased Tj value). Because detachment between the members in a semiconductor device can lead to device failure, the reliability of the semiconductor device deteriorates markedly. Detachment between the members in a semiconductor device can also occur in the reflow step during device mounting. Detachment during the reflow step occurs when the stress generated as a result of the moisture contained in the device vaporizing rapidly and the stress caused by the difference in linear expansion of the members exceeds the adhesive strength between the members.

Furthermore, various investigations are currently being conducted from the viewpoint of the resin sealing material, in order to contend with the increased Tj values of power semiconductor devices. Improving the heat resistance of resin sealing materials is one such example. For example, a resin sealing material with a glass transition temperature exceeding 230° C. exhibits favorable adhesion even in high-temperature regions exceeding 200° C. However, on the other hand, because the resin tends to becomes harder, detachment can occur following moisture absorption reflow testing, meaning the reliability of the power semiconductor device tends to deteriorate.

Accordingly, from the viewpoint of improving the reliability of semiconductor devices, a method that could enhance the adhesion between members in the semiconductor device in order to suppress detachment between the members during high-temperature heat cycle testing and during the reflow step would be very desirable.

In this regard, one known method involves forming a primer layer using a resin material between the members of the semiconductor device, thereby improving the adhesion between the members and preventing detachment. For example, a method has been investigated in which a primer layer that uses a polyamideimide resin is provided between the metal lead frame and the sealing material to suppress detachment (Patent Document 1).

PRIOR ART DOCUMENTS

Patent Documents

Patent Document 1: JP 2013-135061 A

SUMMARY OF THE INVENTION

Problems to be Solved by the Invention

However, as the Tj values of power semiconductor device increase, the conditions required in semiconductor device reliability testing become more stringent, and adequately satisfying these required conditions with conventional resin materials is becoming difficult. Consequently, from the viewpoint of providing power semiconductors of superior reliability, the development of resin materials with excellent heat resistance that can ameliorate detachment between members, for example, in heat cycle testing at high temperatures exceeding 250° C., has become increasingly desirable.

The present invention has been developed in light of the circumstances described above, and provides a resin material that exhibits excellent heat resistance and is capable of improving the adhesion between members to suppress the occurrence of detachment, and in particular, provides a resin material that can be used favorably as a primer layer-forming material that is provided between members of a semiconductor device.

Means to Solve the Problems

From the viewpoint of ameliorating detachment between members in heat cycle testing at high temperatures, the resin material used in forming the primer layer preferably has a glass transition temperature (Tg) that is higher than the upper limit for the drive temperature (Tj) of the power semiconductor. If this Tg value is low, then the heat resistance tends to be inadequate, meaning ensuring favorable adhesion between members becomes difficult, and for example, detachment may occur between the resin sealing layer and the substrate or the semiconductor element.

As a result of intensive investigations relating to the use of polyamideimide resins and resin compositions thereof as resin materials, the inventors of the present invention discovered that a polyamideimide resin having a cardo structure fluorene skeleton exhibits a high Tg value. Further, they also discovered that, for example, when a primer layer is formed between various members, such as between the resin sealing layer and the substrate or the semiconductor element, using a polyamideimide resin having the above specific structural unit, or a resin composition that uses such a resin, excellent adhesion between the members can be obtained, enabling them to complete the present invention.

In other words, embodiments of the present invention relate to the following aspects. However, the present invention is not limited to the aspects described below, and various modifications are possible.

One embodiment relates to a polyamideimide resin containing a structural unit (Ia) represented by a formula shown below, and a structural unit (IIa) represented by a formula shown below.

[Chemical formula 1]

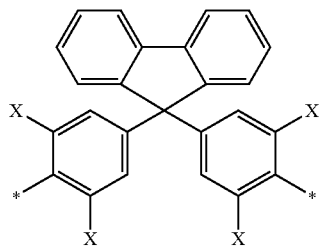

(Ia)

[Chemical formula 2]

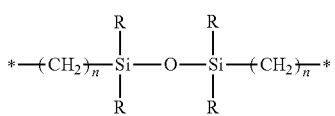

(IIa)

In the above formula (Ia), each X independently represents a hydrogen atom, or at least one substituent selected from the group consisting of halogen atoms, alkyl groups of 1 to 9 carbon atoms, and alkoxy groups and hydroxyalkyl groups of 1 to 9 carbon atoms.

In the above formula (IIa), each R independently represents a hydrogen atom or at least one substituent selected from the group consisting of alkyl groups of 1 to 9 carbon atoms, alkoxy groups of 1 to 9 carbon atoms and halogen atoms, and n represents an integer of 1 to 6.

The polyamideimide resin described above preferably also contains a structural unit (IIIa) represented by a formula shown below.

[Chemical formula 3]

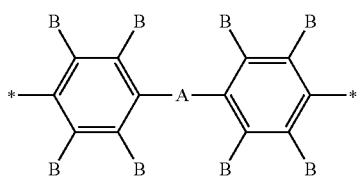

(IIIa)

In the above formula (IIIa),

A represents an oxygen atom, a sulfur atom, one group selected from the group consisting of a carbonyl group, sulfonyl group, methylene group, dimethylmethylene group, hexafluoroisopropylidene group, amide group, ester group, diphenyl ketone group, 1,4-phenyleneoxy group, 1,4-biphenyleneoxy group, sulfonyl-bis(1,4-phenyleneoxy) group, isopropylidene-bis(1,4-phenyleneoxy) group and hexafluoroisopropylidene-bis(1,4-phenyleneoxy) group, or a single bond.

Each B independently represents a hydrogen atom, or at least one substituent selected from the group consisting of alkyl groups of 1 to 9 carbon atoms, alkoxy groups of 1 to 9 carbon atoms, a trifluoromethyl group, carboxylic acid groups, a hydroxy group, and halogen atoms.

The polyamideimide resin described above preferably also contains a structural unit (IVa) represented by a formula shown below.

[Chemical formula 4]

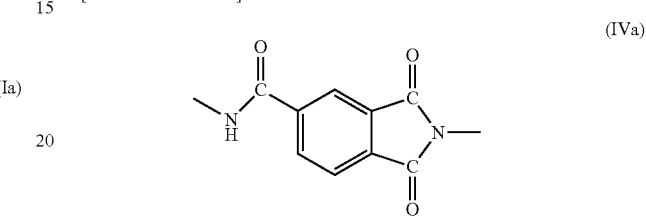

(IVa)

Another embodiment relates to a polyamideimide resin composition comprising the polyamideimide resin of the embodiment described above, and a polar solvent.

The above polyamideimide resin composition preferably also comprises a coupling agent.

The polyamideimide resin composition described above, when used in a laminate obtained by forming a primer layer on a substrate using the polyamideimide resin composition and then forming a resin sealing layer on top of the primer layer, preferably yields a shear strength at 300° C. between the substrate and the resin sealing layer of at least 10 MPa.

The polyamideimide resin composition described above preferably forms a film that exhibits an elastic modulus at 35° C. within a range from 0.5 GPa to 3.5 GPa.

Another embodiment relates to a semiconductor device having a substrate, a semiconductor element mounted on the substrate, a primer layer provided on the semiconductor element mounting surface of the substrate, and a resin sealing layer provided on top of the primer layer, wherein the primer layer is formed using the polyamideimide resin or polyamideimide resin composition of one of the embodiments described above.

The disclosure of the present invention is related to the subject matter disclosed in prior Japanese Application 2019-163154 filed on Sep. 6, 2019, the entire content of which is incorporated by reference herein.

Effects of the Invention

The present invention is able to provide a resin material that exhibits excellent heat resistance, is capable of improving the adhesion between members and suppressing the occurrence of detachment at high temperatures, and can be used favorably as a primer layer-forming material that is provided between members of a semiconductor device. Further, the present invention can also provide a highly reliable semiconductor device using the resin material.

BRIEF DESCRIPTION OF THE DRAWINGS

FIG. 1 is a schematic cross-sectional view illustrating one example of a semiconductor device that represents one embodiment of the invention.

EMBODIMENTS FOR CARRYING OUT THE INVENTION

Preferred embodiments of the present invention are described below in further detail. However, the present invention is not limited to the following embodiments.

Polyamideimide Resin

In one embodiment, the polyamideimide resin contains a structural unit (Ia) represented by a formula shown below, and a structural unit (IIa) represented by a formula shown below.

[Chemical formula 5]

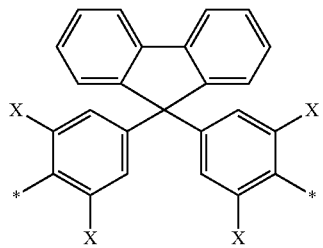

(Ia)

[Chemical formula 6]

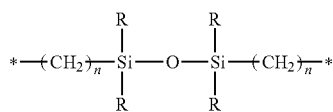

(IIa)

In the above formula (Ia), each X independently represents a hydrogen atom, or at least one substituent selected from the group consisting of halogen atoms, alkyl groups of 1 to 9 carbon atoms, and alkoxy groups and hydroxyalkyl groups of 1 to 9 carbon atoms. The halogen atom may be a fluorine atom, a chlorine atom, or a bromine atom. The above alkyl groups and alkoxy groups may have a linear structure, a branched structure, or a cyclic structure.

In one embodiment, each X is preferably a hydrogen atom, an alkyl group of 1 to 9 carbon atoms, or a halogen atom. The alkyl group is more preferably an alkyl group of 1 to 6 carbon atoms, and even more preferably an alkyl group of 1 to 3 carbon atoms. In one embodiment, each X is preferably a hydrogen atom.

In the above formula (IIa), each R independently represents a hydrogen atom or at least one substituent selected from the group consisting of alkyl groups of 1 to 9 carbon atoms, alkoxy groups of 1 to 9 carbon atoms and halogen atoms. The halogen atom may be a fluorine atom, a chlorine atom, or a bromine atom. The above alkyl groups and alkoxy groups may have a linear structure, a branched structure, or a cyclic structure.

In one embodiment, each R preferably independently represents an alkyl group of 1 to 9 carbon atoms, more preferably an alkyl group of 1 to 6 carbon atoms, and even more preferably an alkyl group of 1 to 3 carbon atoms.

Further, n represents an integer of 1 to 6. Moreover, n is preferably an integer of 2 to 4, and is more preferably 3 or 4.

A polyamideimide resin is a resin having amide linkages and imide linkages within the molecular skeleton, and can be obtained, for example, by a reaction between a diamine component or diisocyanate component and an acid component such as a tricarboxylic acid anhydride. From this type of viewpoint, in one embodiment, the structural unit (Ia) and the structural unit (IIa) described, above can be derived using compounds represented by formula (I) and formula (II) shown below. The structural unit (Ia) and the structural unit (IIa) correspond with the residues following elimination of the substituents (the amino groups or isocyanate groups) from the compounds represented by formula (I) and formula (II) shown below, and may be bonded directly to an amide linkage region or an imide linkage region within the structure of the resin.

[Chemical formula 7]

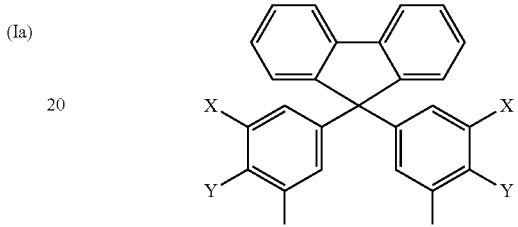

(I)

[Chemical formula 8]

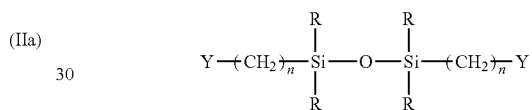

(II)

In the above formulas (I) and (II), each Y represents an amino group ($-NH_2$) or an isocyanate group ($-NCO$), and X, R and n are as described above.

Specific examples of the compound represented by the above formula (I) include 9,9-bis(4-aminophenyl)fluorene, 9,9-bis(4-amino-3-methylphenyl)fluorene, 9,9-bis(4-amino-3-chlorophenyl)fluorene, and 9,9-bis(4-amino-3-fluorophenyl)fluorene. These compounds can be used favorably as diamine compounds capable of generating the structural unit (Ia).

Further, specific examples of the compound represented by the above formula (II) include 1,3-bis(3-aminopropyl)-1,1,3,3-tetramethyldisiloxane, 1,3-bis(2-aminoethyl)-1,1,3,3-tetramethyldisiloxane, 1,3-bis(aminomethyl)-1,1,3,3-tetramethyldisiloxane, 1,3-bis(4-aminobutyl)-1,1,3,3-tetramethyldisiloxane, 1,3-bis(5-aminopentyl)-1,1,3,3-tetramethyldisiloxane, and 1,3-bis(6-aminohexyl)-1,1,3,3-tetramethyldisiloxane.

From the viewpoint of obtaining superior heat resistance, the polyamideimide resin preferably has, for example, a glass transition temperature that is higher than the upper limit for the drive temperature (Tj) of the power semiconductor. In this description, the "glass transition temperature (Tg)" is a value obtained by conducting a dynamic viscoelasticity test using a film obtained by applying and then heating and drying a resin that has been dissolved in a solvent.

In one embodiment, the Tg value for the polyamideimide resin is preferably at least 250° C., more preferably at least 270° C., and even more preferably 300° C. or higher. By using the polyamideimide resin of the embodiment described above, a Tg value of 300° C. or higher can be achieved with ease. In the polyamideimide resin of the above embodiment, it is thought that the structural unit (Ia)

having a skeleton known as a cardo structure contributes to an increase in the Tg value. Accordingly, it is surmised that by using a polyamideimide resin having the structural unit (Ia) within the molecule, excellent heat resistance can be obtained with ease. Generally, the flexibility of films formed from resins having high Tg values tends to decrease, meaning the adhesion tends to deteriorate. However, the polyamideimide resin of the embodiment described above has the structural unit (IIa) in addition to the structural unit (Ia). It is thought that the structural unit (IIa) contributes to an improvement in the flexibility, and as a result, superior film flexibility can be achieved.

In those cases where, for example, the above polyamideimide resin having a Tg value of at least 250° C. is used to form a primer layer provided between the members of a semiconductor device, excellent adhesion can be obtained even during heat cycle testing conducted in a high-temperature region of 250° C. or higher. Further, when a power semiconductor device is constructed using the above resin, the problem wherein heat generated during device operation causes the resin to soften, thereby lowering the adhesion, can be suppressed. Accordingly, when the polyamideimide resin of the embodiment described above is used, excellent reliability can be achieved for the power semiconductor device.

In one embodiment, the structural unit (Ia) preferably includes a structural unit (I-1a) derived from the diamine compound represented by formula (I-1) shown below (9,9-bis(4-aminophenyl)fluorene).

[Chemical formula 9]

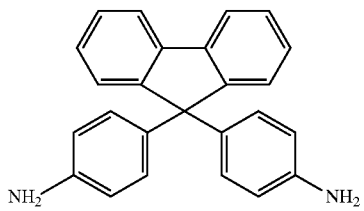

(I-1)

Further, in one embodiment, the structural unit (IIa) preferably includes a structural unit (II-1a) derived from the diamine compound represented by formula (II-1) shown below (1,3-bis(3 aminopropyl)-1,1,3,3-tetramethyldisiloxane).

[Chemical formula 10]

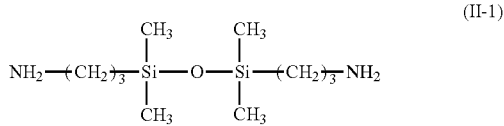

(II-1)

In one embodiment, the polyamideimide resin preferably also contains a structural unit (Ma) represented by a formula shown below. When the above polyamideimide resin has the structural unit (IIIa) in addition to the structural unit (Ia) and the structural unit (IIa), achieving a combination of a high, glass transition temperature (Tg) and favorable resin flexibility tends to be easier.

[Chemical formula 11]

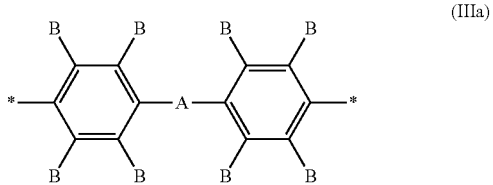

(IIIa)

In the above formula, A represents a divalent group or a single bond. The divalent group is an oxygen atom, a sulfur atom, or one group selected from the group consisting of a carbonyl group, sulfonyl group, methylene group, dimethylmethylene group, hexafluoroisopropylidene group, amide group, ester group, diphenyl ketone group, 1,4-phenyleneoxy group, 1,4-biphenyleneoxy group, sulfonyl-bis(1,4-phenyleneoxy) group, isopropylidene-bis(1,4-phenyleneoxy) group and hexafluoroisopropylidene-bis(1,4-phenyleneoxy) group.

In one embodiment, A is preferably an oxygen atom or a methylene group.

Each B independently represents a hydrogen atom, or at least one substituent selected from the group consisting of alkyl groups of 1 to 9 carbon atoms, alkoxy groups of 1 to 9 carbon atoms, a trifluoromethyl group, carboxylic acid groups, a hydroxy group, and halogen atoms. The halogen atom may be a fluorine atom, a chlorine atom, or a bromine atom.

In one embodiment, each B preferably represents a hydrogen atom or an alkyl group of 1 to 9 carbon atoms. The alkyl group is more preferably an alkyl group of 1 to 6 carbon atoms, and even more preferably an alkyl group of 1 to 3 carbon atoms.

In one embodiment, the above structural unit (IIIa) can be derived using a compound represented by formula (III) shown below. The structural unit (IIIa) corresponds with a residue obtained upon elimination of the amino groups or isocyanate groups represented by Y from the compound represented by the formula (III) shown below, and may be bonded directly to an amide linkage region or an imide linkage region within the structure of the resin.

[Chemical formula 12]

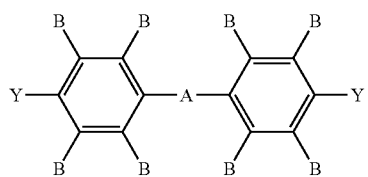

(III)

In the above formula, each Y represents an amino group or an isocyanate group, and A and B are as described above.

In one embodiment, the structural unit (IIIa) preferably includes a structural unit (III-1a) derived from a diamine compound represented by formula (III-1) shown below (4,4'-methylene-bis[2,6-bis(1-methylethyl)benzeneamine]). In another embodiment, the structural unit (IIIa) preferably includes a structural unit (III-2a) derived from a diamine compound represented by formula (III-2) shown below (4,4'-diaminodiphenyl ether). In yet another embodiment, the structural unit (IIIa) preferably includes the above structural unit (III-1a) and the above structural unit (III-2a).

[Chemical formula 13]

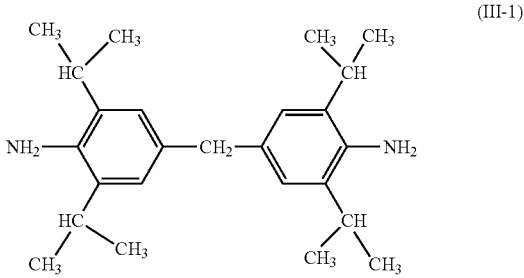

(III-1)

[Chemical formula 14]

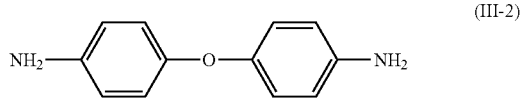

(III-2)

In the polyamideimide resin, the proportion of the structural unit (Ia) relative to the total amount of structural units derived from diamine components and/or diisocyanate components is preferably within a range from 5 to 90 mol %, more preferably from 30 to 80 mol %, and even more preferably from 42 to 48 mol %. The proportion of the structural unit (IIa) relative to the total amount of structural units derived from diamine components and/or diisocyanate components is preferably within a range from 5 to 25 mol %, more preferably from 8 to 20 mol %, and even more preferably from 8 to 12 mol %.

In the polyamideimide resin, the total of the proportions of the above structural units (Ia) and (IIa) is preferably at least 5 mol %, more preferably at least 10 mol %, and even more preferably 15 mol % or greater. In one embodiment, the total of the proportions may be 100 mol %. Here, a proportion (mol %) of a structural unit is calculated from the number of moles added of the monomer compound corresponding with each structural unit.

In another embodiment, the polyamideimide resin preferably also contains the structural unit (IIIa). In this embodiment, the proportion of the structural unit (IIIa) relative to the total amount of structural units derived from diamine components and/or diisocyanate components is preferably not more than 52 mol %, more preferably not more than 50 mol %, and even more preferably 47 mol % or less.

Although not a particular limitation, the proportion of the structural unit (IIIa) relative to the total amount of structural units derived from diamine components and/or diisocyanate components is preferably at least 10 mol %, more preferably at least 15 mol %, and even more preferably 18 mol % or greater. In one embodiment, the total of the proportions of the above structural units (Ia), (IIa) and (IIIa) may be 100 mol %.

In yet another embodiment, in addition to the above structural units (Ia) and (IIa), and where necessary the structural unit (IIIa), the polyamideimide resin may also contain a structural unit derived from a different aromatic diamine or aromatic diisocyanate, aliphatic diamine or aliphatic diisocyanate, or alicyclic diamine or alicyclic diisocyanate. The proportion of this type of structural unit, relative to the total amount of structural units derived from diamine components and/or diisocyanate components, is preferably not more than 20 mol %.

Examples of aromatic diamines (and diisocyanates) include:
2,7-diaminofluorene,
9,9-bis[4-(4-aminophenoxy)phenyl]-9H-fluorene,
2,2'-ditrifluoromethyl-4,4'-diaminobiphenyl,
4,4'-diaminodiphenylsulfone,
3,3-diaminodiphenylsulfone,
4,4'-diamino-2,2'-biphenyldisulfonic acid,
3,4'-diaminodiphenyl ether,
bis[4-(4-aminophenoxy)phenyl]sulfone,
bis[4-(3-aminophenoxy)phenyl]sulfone,
2,2'-bis[4-(4-aminophenoxy)phenyl]propane,
1,4-bis(4-aminophenoxy)benzene,
1,3-bis(3-aminophenoxy)benzene,
2,2-bis(4-aminophenyl)hexafluoropropane,
1,4-phenylenediamine,
2-chloro-1,4-phenylenediamine,
1,3-phenylenediamine,
4,4'-diaminobenzophenone,
3,3-diaminobenzophenone,
3,4'-diaminodiphenylmethane,
4,4'-diaminobenzanilide,
3,6-diaminocarbazole,
4,4'-bis(4-aminophenoxy)biphenyl,
2-trifluoromethyl-1,4-diaminobenzene,
2,2-bis[4-(4-aminophenoxy)phenyl]hexafluoropropane,
2,2-bis(aminophenyl)hexafluoropropane,
2,2'-bis(trifluoromethyl)benzidine,
2,2'-ditrifluoromethyl-4,4'-diaminobiphenyl ether,
4-aminophenyl sulfide,
4,4'-diamino-3,3'-dimethylbiphenyl,
naphthalenediamine, and
naphthalene diisocyanate.

Examples of aliphatic diamines (and diisocyanates) include:
1,4-cyclohexanediamine,
1,3-cyclohexanediamine,
1,4-di(aminomethyl)cyclohexane,
1,3-bis(aminomethyl)cyclohexane,
bis(aminomethyl)norbornane,
4,4'-methylene-bis(cyclohexylamine),
hexamethylenediamine, and
hexamethylene diisocyanate.

In one embodiment, in those cases where a diamine is used when producing the polyamideimide resin, the use of an acid halide of trimellitic anhydride as the acid component is preferred, and among the various options, the use of trimellitic anhydride chloride represented by formula (IV) shown below is particularly preferred.

[Chemical formula 15]

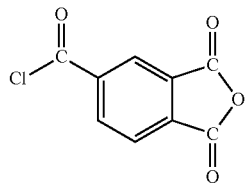

(IV)

From the viewpoints described above, in one embodiment, the polyamideimide resin preferably contains a structural unit, represented by formula (IVa) shown below.

[Chemical formula 16]

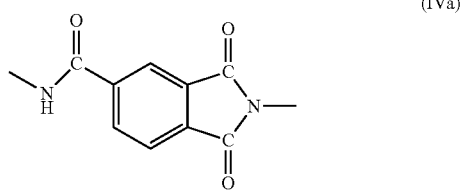

(IVa)

In one embodiment, the polyamideimide resin may be a resin obtained using compounds represented by formula (I) and formula (II) above as the diamine component or diisocyanate component, and using the compound represented by formula (IV) shown above as the acid component. In another embodiment, the resin may be obtained by also adding a compound, represented by formula (III) shown above as a diamine component or diisocyanate component. In yet another embodiment, the polyamideimide resin may be a resin obtained by also using another acid component, in addition to the compound represented by the above formula (IV), as the acid component.

Examples of acid components that may be used include tricarboxylic anhydrides or acid halides thereof other than the compound represented by the above formula (IV), and tricarboxylic acids such as trimellitic acid. Further, other compounds including tetracarboxylic dianhydrides such as pyromellitic anhydride and biphenyltetracarboxylic dianhydride, aromatic dicarboxylic acids such as terephthalic acid and isophthalic acid, alicyclic dicarboxylic acids such as cyclohexanedicarboxylic acid, and aliphatic dicarboxylic acids such as adipic acid and sebacic acid may also be used as the acid component.

The weight average molecular weight (Mw) of the polyamideimide resin is preferably within a range from 30,000 to 120,000. A polyamideimide resin having a Mw value within this range can more readily form a coating film of the preferred thickness described below during the coating operation. The Mw value of the polyamideimide resin is more preferably within a range from 35,000 to 110,000, and even more preferably within a range from 38,000 to 100,000. In this description, "Mw" values represent values measured relative to standard polystyrenes using gel permeation chromatography.

From the viewpoints of workability and the like during coating film formation, the polyamideimide resin is preferably soluble in an organic solvent at room temperature. In this description, the expression "soluble in an organic solvent at room temperature" means that when a solution obtained by adding the organic solvent to the resin and stirring at room temperature is inspected visually, there is no sediment and no turbidity, with the entire solution having a transparent state. The above-mentioned "room temperature" may be within a range from about 10° C. to 40° C., and is preferably within a range from 20° C. to 30° C. In one embodiment, the above-mentioned "solution" means, for example, a solution obtained by adding 1 to 30 g of a powder of the above resin to 100 mL of the organic solvent. The organic solvent is described below.

Method for Producing Polyamideimide Resin

The polyamideimide resin can be produced by conventional methods, and there are no particular limitations. For example, the polyamideimide resin can be produced via reaction between a diamine component and/or a diisocyanate component, and an acid component. The diamine component, the diisocyanate component and the acid component are as described above. The reaction may be performed in a solventless state or in the presence of an organic solvent. The reaction temperature is preferably within a range from 25° C. to 250° C. The reaction time may be set as appropriate in accordance with factors such as the batch scale and the reaction conditions being employed.

There are no particular limitations on the organic solvent (reaction solvent) used during production of the polyamideimide resin. Examples of organic solvents that may be used include ether-based solvents such as diethylene glycol dimethyl ether, diethylene glycol diethyl ether, triethylene glycol dimethyl ether and triethylene glycol diethyl ether, sulfur-containing solvents such as dimethylsulfoxide, diethylsulfoxide, dimethylsulfone and sulfolane, cyclic ester-based (lactone-based) solvents such as γ-butyrolactone, acyclic ester-based solvents such as cellosolve acetate, ketone-based solvents such as cyclohexanone and methyl ethyl ketone, nitrogen-containing solvents such as N-methyl-2-pyrrolidone, dimethylacetamide and 1,3-dimethyl-3,4,5,6-tetrahydro-2(1H)-pyrimidinone, and aromatic hydrocarbon-based solvents such as toluene and xylene. One of these organic solvents may be used alone, or a combination of two or more organic solvents may be used.

In one embodiment, an organic solvent that is capable of dissolving the produced resin is preferably selected and used, and the use of a polar solvent is preferred. Details regarding polar solvents are described below, but, for example, nitrogen-containing solvents are preferred.

In one embodiment, the polyamideimide resin can be produced by a method in which a precursor to the polyamideimide resin is first produced by a reaction between the acid component and the diamine component, and this precursor is then subjected to a dehydration cyclization to obtain the polyamideimide resin. However, there are no particular limitations on the precursor cyclization method, and any method that is known in the technical field may be used. For example, a heat cyclization method in which the dehydration cyclization is achieved by conducting heating either at normal pressure or under reduced pressure, or a chemical cyclization method that uses a dehydration agent such as acetic anhydride, either in the presence of a catalyst or without a catalyst, may be used.

In the case of a heat cyclization method, the cyclization is preferably performed while the water produced by the dehydration reaction is removed from the system. During the dehydration reaction, the reaction liquid may be heated to a temperature within a range from 80° C. to 400° C., and preferably from 100° C. to 250° C. Further, the water may also be removed by azeotropic distillation by using an organic solvent capable of forming an azeotrope with water, such as benzene, toluene or xylene.

In the case of a chemical cyclization method, the reaction may be performed in the presence of a chemical dehydration agent, at a temperature within a range from 0° C. to 120° C., and preferably from 10° C. to 80° C. Examples of chemical dehydration agents that can be used favorably include acid anhydrides such as acetic anhydride, propionic anhydride, butyric anhydride and benzoic anhydride, and carbodiimide compounds such as dicyclohexylcarbodiimide. During the reaction, a material that accelerates the cyclization reaction such as pyridine, isoquinoline, trimethylamine, triethylamine, aminopyridine or imidazole is also preferably used in combination with the chemical dehydration agent.

The chemical dehydration agent may be used in a ratio of 90 to 600 mol % relative to the total amount of the diamine component, and the material that accelerates the cyclization reaction may be used in a ratio of 40 to 300 mol % relative to the total amount of the diamine component. Further, a dehydration catalyst, including phosphorus compounds such as triphenyl phosphite, tricyclohexyl phosphite, triphenyl phosphate, phosphoric acid and phosphorus pentoxide, and boron compounds such as boric acid and boric anhydride, may also be used.

In the production of the polyamideimide resin, the usage ratio (molar ratio) between the acid component and the diamine component (diisocyanate component) is not particularly limited, and may be adjusted to ensure that the reaction proceeds with neither excess nor deficiency. In one embodiment, from the viewpoints of the molecular weight and the degree of crosslinking of the produced polyamideimide resin, the total amount of the diamine component per 1.00 mol of the total acid component is preferably within a range from 0.90 to 1.10 mol, more preferably from 0.95 to 1.05 mol, and even more preferably from 0.97 to 1.03 mol.

Polyamideimide Resin Composition

In one embodiment, a polyamideimide resin composition (hereafter sometimes abbreviated as "the resin composition") comprises the polyamideimide resin of an embodiment described above, and a solvent. In this description, the resin composition is sometimes referred to as a varnish.

Solvent

There are no particular limitations on the solvent, provided it is capable of dissolving the polyamideimide resin. In this description, the expression "solvent capable of dissolving the polyamideimide resin" means that when a solution is prepared by adding and mixing a powder of the polyamideimide resin with the solvent, without any particular restriction of the temperature of the solvent, and the solution is then inspected visually, no sedimentation or turbidity is visible, with the entire solution existing in a transparent state. In one embodiment, the solvent that constitutes the resin composition may be the same solvent as the reaction solvent used during production of the resin. The use of a polar solvent is particularly preferred.

Examples of polar solvents include nitrogen-containing compounds such as N-methylpyrrolidone, dimethylacetamide, dimethylformamide and 1,3-dimethyltetrahydro-2 (1H)-pyrimidinone, sulfur-containing compounds such as sulfolane and dimethylsulfoxide, lactones such as γ-butyrolactone, γ-valerolactone, γ-caprolactone, γ-heptalactone, α-acetyl-γ-butyrolactone and ε-caprolactone, ketones such as methyl ethyl ketone, methyl isobutyl ketone, cyclohexanone and acetophenone, acyclic esters such as cellosolve acetate, and ethers including ethylene glycol, glycerol, diethylene glycol dialkyl ethers such as diethylene glycol dimethyl ether, diethylene glycol diethyl ether, diethylene glycol dipropyl ether and diethylene glycol dibutyl ether, triethylene glycol dialkyl ethers such as triethylene glycol dimethyl ether, triethylene glycol diethyl ether, triethylene glycol dipropyl ether and triethylene glycol dibutyl ether, tetraethylene glycol dialkyl ethers such as tetraethylene glycol dimethyl ether, tetraethylene glycol diethyl ether, tetraethylene glycol dipropyl ether and tetraethylene glycol dibutyl ether, diethylene glycol monoalkyl ethers such as diethylene glycol monomethyl ether and diethylene glycol monoethyl ether, triethylene glycol monoalkyl ethers such as triethylene glycol monomethyl ether and triethylene glycol monoethyl ether, and tetraethylene glycol monoalkyl ethers such as tetraethylene glycol monomethyl ether and tetraethylene glycol monoethyl ether.

In one embodiment, the solvent is preferably at least one solvent selected from the group consisting of diethylene glycol dimethyl ether, triethylene glycol, triethylene glycol dimethyl ether, N-methyl-2-pyrrolidone, γ-butyrolactone, γ-valerolactone, δ-valerolactone, γ-caprolactone, ε-caprolactone, α-methyl-γ-butyrolactone, ethyl cellosolve, ethyl cellosolve acetate, butyl cellosolve, butyl cellosolve acetate, cyclopentanone, cyclohexanone, tetrahydrofuran, 1,4-dioxane, dibutyl ether, dimethylsulfoxide, 1,3-dimethyl-2-imidazolidinone, dimethylacetamide, N,N-dimethylformamide, ethylene carbonate, propylene carbonate and propylene glycol methyl acetate. In those cases where a combination of two or more solvents is used, the solvents maybe mixed in any arbitrary ratio.

Among the above solvents, from the viewpoint of film formability, a solvent with a comparatively low boiling point is preferred. For example, diethylene glycol dimethyl ether, triethylene glycol, and triethylene glycol dimethyl ether and the like can be used favorably.

The blend amount of the solvent in the above resin composition may be adjusted appropriately with due consideration of the viscosity. Although not a particular limitation, in one embodiment, the blend amount of the solvent is preferably within a range from 500 to 3,500 parts by weight per 100 parts by weight of the total amount of resin in the resin composition. The solvent is more preferably added in a ratio within a range from 500 to 2,000 parts by weight per 100 parts by weight of the total amount of resin.

Additives

If required, additives such as colorants and coupling agents, and additional components such as resin modifiers may be added to the above polyamideimide resin composition (varnish). In those cases where the polyamideimide resin composition contains additional components, the blend amount of those additional components is preferably not more than 50 parts by weight per 100 parts by weight of the total weight of polyamideimide resin (solid fraction) in the polyamideimide resin composition. By ensuring that the blend amount of these additional components is not more than 50 parts by weight, any deterioration in the physical properties of the obtained coating film can be more easily suppressed.

In one embodiment, the polyamideimide resin composition may contain a coupling agent. Examples of additional components that may be used are described below.

Coupling Agents

There are no particular limitations on the types of coupling agents that may be used, and examples include silane-based, titanium-based and aluminum-based coupling agents, but silane-based coupling agents are the most preferred. There are no particular limitations on the silane-based coupling agents, and examples include vinyltrichlorosilane, vinyltris(β-methoxyethoxy)silane, vinyltriethoxysilane, vinyltrimethoxysilane, γ-methacryloxypropyltrimethoxysilane, γ-methacryloxypropylmethyldimethoxysilane, β-(3,4-epoxycyclohexyl)ethyltrimethoxysilane, γ-glycidoxypropyltrimethoxysilane, γ-glycidoxypropylmethyldimethoxysilane, γ-glycidoxypropylmethyldiethoxysilane, N-β-(aminoethyl)-γ-aminopropyltrimethoxysilane, N-β-(aminoethyl)-γ-aminopropylmethyldimethoxysilane, γ-aminopropyltriethoxysilane, N-phenyl-γ-aminopropyltrimethoxysilane, γ-mercaptopropyltrimethoxysilane, γ-mercaptopropyltriethoxysilane, 3-aminopropylmethyldiethoxysilane, 3-ureidopropyltriethoxysilane, 3-ureidopropyltrimethoxysilane, 3-aminopropyltrimethoxysilane, 3-aminopropyl-tris[2-(2-methoxyethoxy)ethoxy]silane, N-methyl-3-aminopropyltrimethoxysilane, triaminopropyltrimethoxysilane, 3-4,5-dihydroimidazol-1-yl-propyltrimethoxysilane, 3-methacryloxypropyltrimethoxysilane, 3-mercaptopropylmethyldimethoxysilane, 3-chloropropylmethyldimethoxysilane, 3-chloropropyldimethoxysilane, 3-cyanopropyltriethoxysilane, hexamethyldisilazane, N,O-bis(trimethylsilyl)acetamide, methyltrimethoxysilane, methyltriethoxysilane, ethyltrichlorosilane, n-propyltrimethoxysilane, isobutyltrimethoxysilane, amyltrichlorosilane, octyltriethoxysilane, phenyltrimethoxysilane, phenyltriethoxysilane, methyltri(methacryloyloxyethoxy)silane, methyltri(glycidyloxy)silane, N-β-(N-vinylbenzylaminoethyl)-γ-aminopropyltrimethoxysilane, octadecyldimethyl-[3-(trimethoxysilyl)propyl]ammonium chloride, γ-chloropropylmethyldichlorosilane, γ-chloropropylmethyldimethoxysilane, γ-chloropropylmethyldiethoxysilane, trimethylsilyl isocyanate, dimethylsilyl isocyanate, methylsilyl triisocyanate, vinylsilyl triisocyanate, phenylsilyl triisocyanate, tetraisocyanatosilane, and ethoxysilane isocyanate. One of these silane-based coupling agents may be used alone, or a combination of two or more silane-based coupling agents may be used.

There are no particular limitations on the titanium-based coupling agents, and examples include isopropyltrioctanoyl titanate, isopropyldimethacrylisostearoyl titanate, isopropyltridodecylbenzenesulfonyl titanate, isopropylisostearoyldiacryl titanate, isopropyltri(dioctyl phosphate) titanate, isopropyltricumylphenyl titanate, isopropyltris(dioctyl pyrophosphate) titanate, isopropyltris(n-aminoethyl) titanate, tetraisopropylbis(dioctyl phosphite) titanate, tetraoctylbis(ditridecyl phosphite) titanate, tetra(2,2-diallyloxymethyl-1-butyl)-bis(ditridecyl) phosphite titanate, dicumylphenyloxyacetate titanate, bis(dioctyl pyrophosphate)oxyacetate titanate, tetraisopropyl titanate, tetra-normal-butyl titanate, butyl titanate dimer, tetra(2-ethylhexyl) titanate, titanium acetylacetonate, polytitanium acetylacetonate, titanium octylene glycolate, ammonium titanium lactate, titanium lactate, titanium lactate ethyl ester, titanium triethanolaminate, polyhydroxytitanium stearate, tetramethyl orthotitanate, tetraethyl orthotitanate, tetrapropyl orthotitanate, tetraisobutyl orthotitanate, stearyl titanate, cresyl titanate monomer, cresyl titanate polymer, diisopropoxy-bis(2,4-pentadionate) titanium(IV), diisopropyl-bis-triethanolaminotitanate, octylene glycol titanate, tetra-n-butoxytitanium polymer, tri-n-butoxytitanium monostearate polymer, and tri-n-butoxytitanium monostearate. One of these titanium-based coupling agents may be used alone, or a combination of two or more titanium-based coupling agents may be used.

There are no particular limitations on the aluminum-based coupling agents, and examples include aluminum chelate compounds such as ethylacetoacetatoaluminum diisopropylate, aluminum tris(ethylacetoacetate), alkylacetoacetatoaluminum diisopropylate, aluminum monoacetylacetate bis(ethylacetoacetate), aluminum tris(acetylacetonate), aluminum monoisopropoxymonooleoxyethyl acetoacetate, aluminum di-n-butoxide monoethylacetoacetate, and aluminum diisopropoxide monoethylacetoacetate, and aluminum alcoholates such as aluminum isopropylate, mono-sec-butoxyaluminum diisopropylate, aluminum sec-butylate and aluminum ethylate. One of these aluminum-based coupling agents may be used alone, or a combination of two or more aluminum-based coupling agents may be used.

In one embodiment, the viscosity of the polyamideimide resin composition is preferably within a range from 10 to 400 mPa·s, and more preferably within a range from 10 to 300 mPa·s. Here, the "viscosity" is a value obtained by measuring a varnish, prepared by dissolving the resin in the solvent to achieve a non-volatile fraction (solid fraction component) of 1 to 20%, using an E-type viscometer at 25° C. and 10 rpm. Provided the viscosity measured at 10 rpm is at least 10 mPa·s, a satisfactory film thickness can be more easily ensured during coating. Further, provided the viscosity is not more than 400 mPa·s, a uniform film thickness can be more easily ensured during coating. Accordingly, by adjusting the viscosity to a value within the above range, superior printability can be more easily achieved.

In one embodiment, from the viewpoint of achieving excellent coating properties, the viscosity preferably exceeds 50 mPa·s, and more preferably exceeds 100 mPa·s. If the viscosity is too low, the composition may sometimes spread outside the desired region, making handling difficult.

Measurement of the above viscosity may be performed, for example, using a viscometer (RE type) manufactured by Told Sangyo Co., Ltd. During the measurement, the measurement temperature is set to 25° C.±0.5° C., 1 mL to 1.5 mL of the resin composition (varnish) is then inserted in the viscometer, and the viscosity is recorded 10 minutes after commencing measurement.

In one embodiment, the film thickness obtained upon film formation using the resin composition is not particularly limited, and may be within a range from 0.5 to 50 μm. By ensuring that the film has a thickness within this range, satisfactory adhesion tends to be more easily achieved. From this viewpoint, the film thickness is preferably within a range from 1 to 15 μm, and more preferably within a range from 3 to 15 μm.

In one embodiment, the elastic modulus at 35° C. of a film obtained by applying and then heating and drying the resin composition (varnish) is preferably within a range from 0.5 to 8.0 GPa, and more preferably within a range from 1.0 to 5.0 GPa. The heating and drying used for forming the film may, for example, involve heating at 50° C. for 10 minutes, and then conducting drying at 200° C. for one hour. The above elastic modulus is a value measured using a dynamic viscoelasticity measurement device. From the viewpoint of further enhancing the reliability of power semiconductor devices, the film preferably has an appropriate level of flexibility. Accordingly, in one embodiment, the elastic modulus of the film is more preferably within a range from 2.0 GPa to 4.5 GPa.

The elastic modulus can be measured, for example, using a dynamic viscoelasticity measurement device "Rheogel-E4000" manufactured by UBM Co., Ltd. The elastic modulus is a value obtained, for example, using a film obtained by applying and drying the resin composition (varnish), by conducting a measurement under conditions including a measurement frequency of 10 MHz and a measurement temperature of 35° C.

The resin composition of an embodiment described above has excellent heat resistance and flexibility, and can therefore be used favorably as a constituent material of a semiconductor device. For example, the resin composition can be used for forming an insulating layer, adhesive layer, or protective layer or the like in a semiconductor device, and semiconductor devices having these layers exhibit excellent adhesion between the various members, and superior reliability.

In one embodiment, the resin composition can be used favorably in a semiconductor device for forming a primer layer provided between the sealing material and the substrate, or between the sealing material and the semiconductor element or the like. The adhesion between the various members can be evaluated using the shear strength.

In one embodiment, the shear strength at 300° C. between members having a primer layer formed from the above resin composition is preferably at least 10 MPa, and more preferably 15 MPa or greater. Provided this shear strength at 300° C. is at least 10 MPa, excellent adhesion can be more easily achieved even when using the resin composition in a power semiconductor device.

In one embodiment, in a laminate having a primer layer formed from the resin composition and then a resin sealing layer provided on a substrate, the shear strength at 300° C. between the substrate and the resin sealing layer can be increased to at least 10 MPa. The laminate can be obtained by applying the resin composition (varnish) to the substrate and drying the composition to form a film, and subsequently forming the resin sealing layer on top of the film.

Measurement of the shear strength can be conducted, for example, using a shear strength measurement device (such as the 4000-series manufactured by Nordson Advanced Technology Corporation). The measurement is performed, for example, using a sample obtained by applying the resin composition to a Ni substrate and drying the composition to form a film, and then molding a resin sealing layer of ⌀5 mm on top of the film using an epoxy-based sealing resin. The conditions during measurement typically include a heat stage temperature of 300° C. and a probe speed of 5 mm/min. The material for the substrate and the sealing material for forming the resin sealing layer may also be altered as appropriate.

In the measurement, a Cu substrate may be used instead of the Ni substrate, or a substrate having Ag plating on a Cu substrate may be used.

Semiconductor Device

One embodiment relates to a semiconductor device having a dried film formed using the resin composition of an embodiment described above. The constituent members of the semiconductor device typically include a semiconductor element and a sealing member (sealing layer). The semiconductor element is typically formed from a semiconductor chip (Si, SiC, GaN), Cu, Ni plating, Ag plating, Au plating, Au/Pd/Ni plating, solder, sintered silver, sintered copper, Al wiring, Au wiring, and inorganic materials such as a ceramic substrate (alumina, alumina-zirconia, aluminum nitride, silicon nitride). Further, the sealing layer is typically formed from an organic material such as a resin. In the following description, a sealing layer formed from a resin is referred to as a resin sealing layer.

In the semiconductor device described above, by forming a dried film using the resin composition of an embodiment described above as a primer layer between the constituent elements, the adhesion between the constituent elements can be easily enhanced. More specifically, for example, by forming a dried film of the resin composition between the resin sealing layer and the substrate, or between the resin sealing layer and the semiconductor element, favorable adhesion can be ensured between the various members, and detachment during cycle testing can be prevented. From this type of viewpoint, in one embodiment, the semiconductor device has a substrate, a semiconductor element mounted on top of the substrate, a primer layer provided on at least the semiconductor element mounting surface of the substrate, and a resin sealing layer provided on top of the primer layer, wherein the primer layer is preferably composed of a dried film formed using the semiconductor device resin composition of an embodiment described above. The substrate may be a lead frame composed of a die pad for mounting the semiconductor element and leads, wherein the electrode pads of the semiconductor element and the leads of the lead frame are connected electrically via wires.

In one embodiment, the resin composition described above can be used favorably as a constituent material of a power semiconductor device that uses an above-mentioned silicon carbide (SiC) substrate or gallium nitride (GaN) substrate. When a power semiconductor device is formed using the above resin composition, any deterioration in the adhesive strength between the various members during heat cycle testing can be easily suppressed.

A representative structure of the semiconductor device of an embodiment described above is described below in detail with reference to the drawing. FIG. 1 is a schematic cross-sectional view illustrating an embodiment of the semiconductor device. The semiconductor device illustrated in FIG. 1 has a die pad 1*a*, a semiconductor element 2, a primer layer 3, leads 1*b*, wires 4, and a resin sealing layer 5, wherein the primer layer 3 is formed from the resin composition of an embodiment described above. As illustrated in FIG. 1, by providing the primer layer 3 formed from the resin composition on the semiconductor element mounting surface of the substrate 1 that contacts the resin sealing layer 5 (and the surfaces of the leads 1*b* and the die pad 1*a* on which the semiconductor element 2 is mounted), the adhesion between the various members can be enhanced with ease.

In one embodiment, a method for producing a semiconductor device has, at least, a step of forming a primer layer by applying the resin composition of an embodiment described above to the surface of a substrate on which a semiconductor element has been mounted and then drying the composition, and a step of forming a resin sealing layer on top of the primer layer.

In this embodiment, the primer layer is formed using the resin composition of an embodiment described above. From the viewpoint of workability, a resin composition (varnish) containing a polyamideimide resin as the resin component is preferably used. The primer layer can be obtained by applying the resin composition to the prescribed location, and then drying the coating film.

There are no particular limitations on the materials for the lead frame composed of the die pad used for mounting the semiconductor element and the leads, and conventional materials known in the technical field may be selected. From the viewpoint of application to power semiconductor devices, the die pad material preferably contains at least one material selected from the group consisting of Ni and Cu. Further, a material having Ag plating on the surface of a material selected from the group consisting of Ni and Cu may also be used. The lead material of the lead frame is preferably selected from the group consisting of Ni and Cu.

The material of the semiconductor element is not particularly limited, and for example, may be a silicon wafer, or a silicon carbide wafer or the like.

The resin sealing layer may be formed using a sealing material that is known in the technical field. For example, the resin sealing material may be a liquid or solid epoxy-based resin composition. The resin sealing layer can be formed, for example, by transfer molding using the resin sealing material.

In another embodiment, the method for producing the semiconductor device has, for example, a step of applying the resin composition of an embodiment described above to a semiconductor substrate on which a plurality of wires of the same structure have been formed and then drying the composition to form a resin layer, and, if necessary, a step of forming rewiring on top of the resin layer to electrically connect to the electrodes on the semiconductor substrate. Further, in addition to these steps, if necessary, the production method may also include a step of forming a protective layer (resin layer) on top of the rewiring or the resin layer using the resin composition of an embodiment described above. Moreover, in addition to the above steps, if necessary, the production may also include a step of forming external electrode terminals on the above resin layer, and then a step of performing dicing as necessary.

There are no particular limitations on the coating method used for forming the above resin layer (primer layer), but spin coating, spray coating, or dispensing coating is preferred. The method used for drying the resin layer may employ a method that is known in the technical field. The resin composition of the embodiments described above also exhibits excellent characteristics such as sputtering resistance, plating resistance and alkali resistance, which may be necessary in the step of forming the rewiring. For these reasons, the resin composition of the above embodiments is not limited to the types of semiconductor device structures described above, and can be used favorably as a material in all manner of semiconductor devices.

EXAMPLES

The present invention is described below in further detail using a series of examples, but the present invention is not limited to these examples, and includes all manner of examples.

<1> Synthesis of Polyamideimide Resins

Synthesis Example 1

A 1-liter four-neck flask fitted with a thermometer, a stirrer, a nitrogen inlet tube and a condenser fitted with an oil-water separator was charged, under a stream of nitrogen, with 15.7 g of 9,9-bis(4-aminophenyl)fluorene, 16.5 g of 4,4'-methylenebis[2,6-bis(1-methylethyl)benzeneamine], and 2.5 g of 1,3-bis(3-aminopropyl)-1,1,3,3-tetramethyldisiloxane, and these components were then dissolved by adding 298 g of N-methyl-2-pyrrolidone (hereafter referred to as NMP), thus obtaining a solution.

Subsequently, 21.1 g of trimellitic anhydride chloride (hereafter referred to as TAC) was added to the above solution while the flask was cooled to ensure that the temperature did not exceed 20° C. After stirring for two hours at room temperature, 12.1 g of triethylamine (hereafter referred to as TEA) was added, and the reaction was then allowed to proceed for at least 15 hours at room temperature, thus obtaining a polyamic acid solution.

The obtained polyamic acid solution was then further heated at 180° C. for 6 hours, thus yielding a polyamideimide resin solution. This polyamideimide resin solution was poured into water, and the resulting precipitate was separated, crushed, and dried to obtain a powdered polyamideimide resin (PAI-1). The thus obtained polyamideimide resin powder (PAI-1) was soluble in a polar solvent (NMP) at room temperature (25° C.).

Measurement of the weight average molecular weight (Mw) of the obtained polyamideimide resin (PAI-1) using gel permeation chromatography (hereafter referred to as GPC) referenced against standard polystyrenes revealed a Mw value of 67,000.

The GPC measurement conditions were as follows.
Feed pump: LC-20AD
UV-Vis detector: SPD-20A
Flow rate: 1 mL/min
Column temperature: 40° C.
Molecular weight standards: standard polystyrenes Synthesis Example 2

A 1-liter four-neck flask fitted with a thermometer, a stirrer, a nitrogen inlet tube and a condenser fitted with an oil-water separator was charged, under a stream of nitrogen, with 5.0 g of 4,4'-diaminodiphenyl ether, 8.7 g of 9,9-bis(4-aminophenyl)fluorene, 18.3 g of 4,4'-methylenebis[2,6-bis(1-methylethyl)benzeneamine], and 2.8 g of 1,3-bis(3-aminopropyl)-1,1,3,3-tetramethyldisiloxane, and these components were then dissolved by adding 310 g of NMP, thus obtaining a solution.

Subsequently, 23.4 g of TAC was added to the above solution while the flask was cooled to ensure that the temperature did not exceed 20° C. After stirring for two hours at room temperature, 13.5 g of TEA was added, and the reaction was then allowed to proceed for at least 15 hours at room temperature, thus producing a polyamic acid solution.

The obtained polyamic acid solution was then further heated at 180° C. for 6 hours, thus yielding a polyamideimide resin solution. This polyamideimide resin solution was poured into water, and the resulting precipitate was separated, crushed, and dried to obtain a powdered polyamideimide resin (PAI-2). The thus obtained polyamideimide resin powder (PAI-2) was soluble in a polar solvent (NMP) at room temperature (25° C.).

Measurement of the weight average molecular weight (Mw) of the obtained polyamideimide resin (PAI-2) using GPC referenced against standard polystyrenes revealed a Mw value of 54,000.

Synthesis Example 3

A 1-liter four-neck flask fitted with a thermometer, a stirrer, a nitrogen inlet tube and a condenser fitted with an oil-water separator was charged, under a stream of nitrogen, with 16.9 g of 9,9-bis(4-amino-3-methylphenyl)fluorene, 16.5 g of 4,4'-methylenebis[2,6-bis(1-methylethyl)benzeneamine], and 2.5 g of 1,3-bis(3-aminopropyl)-1,1,3,3-tetramethyldisiloxane, and these components were then dissolved by adding 307 g of NMP, thus obtaining a solution.

Subsequently, 21.1 g of TAC was added to the above solution while the flask was cooled to ensure that the temperature did not exceed 20° C. After stirring for two hours at room temperature, 12.1 g of TEA was added, and the reaction was then allowed to proceed for at least 15 hours at room temperature, thus obtaining a polyamic acid solution.

The obtained polyamic acid solution was then further heated at 180° C. for 6 hours, thus yielding a polyamideimide resin solution. This polyamideimide resin solution was poured into water, and the resulting precipitate was separated, crushed, and dried to obtain a powdered polyamideimide resin (PAI-3). The thus obtained polyamideimide resin powder (PAI-3) was soluble in a polar solvent (NMP) at room temperature (25° C.).

Measurement of the weight average molecular weight (Mw) of the obtained polyamideimide resin (PAI-3) using GPC referenced against standard polystyrenes revealed a Mw value of 60,000.

Synthesis Example 4

A 1-liter four-neck flask fitted with a thermometer, a stirrer, a nitrogen inlet tube and a condenser fitted with an oil-water separator was charged, under a stream of nitrogen, with 102.4 g of 2,2-bis[4-(4-aminophenoxy)phenyl]propane and 6.9 g of 1,3-bis(3-aminopropyl)-1,1,3,3-tetramethyldisiloxane, and these components were then dissolved by adding 700 g of NMP, thus obtaining a solution.

Subsequently, 59.0 g of TAC was added to the above solution while the flask was cooled to ensure that the temperature of the reaction solution did not exceed 20° C. After stirring for one hour at room temperature, 34.0 g of TEA was added while the flask was cooled to ensure that the temperature of the reaction solution did not exceed 20° C., and the reaction was then allowed to proceed for three hours at room temperature, thus producing a polyamic acid solution.

The obtained polyamic acid solution was then subjected to a dehydration condensation at 190° C. over a period of 6 hours, thus producing a polyamideimide resin solution.

This polyamideimide resin varnish was poured into water, and the resulting precipitate was separated, crushed, and dried to obtain a powdered polyamideimide resin (PAI-4). Measurement of the weight average molecular weight (Mw) of the obtained polyamideimide resin (PAI-4) using gel permeation chromatography (GPC) referenced against standard polystyrenes revealed a Mw value of 75,000.

Synthesis Example 5

A 1-liter four-neck flask fitted with a thermometer, a stirrer, a nitrogen inlet tube and a condenser fitted with an oil-water separator was charged, under a stream of nitrogen, with 15.0 g of 2,2-bis[4-(4-aminophenoxy)phenyl]hexafluoropropane, 10.6 g of 4,4'-methylenebis[2,6-bis(1-methylethyl)benzeneamine], and 1.6 g of 1,3-bis(3-aminopropyl)-1,1,3,3-tetramethyldisiloxane, and these components were then dissolved by adding 220 g of NMP, thus obtaining a solution.

Subsequently, 13.6 g of TAC was added to the above solution while the flask was cooled to ensure that the temperature of the reaction solution did not exceed 20° C. After stirring for two hours at room temperature, 7.8 g of TEA was added while the flask was cooled to ensure that the temperature of the reaction solution did not exceed 20° C., and the reaction was then allowed to proceed for at least 15 hours at room temperature, thus producing a polyamic acid solution.

The obtained polyamic acid solution was then further heated at 180° C. for 6 hours, thus producing a polyamideimide resin solution.

This polyamideimide resin varnish was poured into water, and the resulting precipitate was separated, crushed, and dried to obtain a powdered polyamideimide resin (PAI-5). Measurement of the weight average molecular weight (Mw) of the obtained polyamideimide resin (PAI-5) using gel permeation chromatography (GPC) referenced against standard polystyrenes revealed a Mw value of 40,000.

Synthesis Example 6

A 1-liter four-neck flask fitted with a thermometer, a stirrer, a nitrogen inlet tube and a condenser fitted with an oil-water separator was charged, under a stream of nitrogen, with 3.5 g of 4,4'-diaminodiphenyl ether, 9.1 g of 2,2-bis[4-(4-aminophenoxy)phenyl]hexafluoropropane, 12.8 g of 4,4'-methylenebis[2,6-bis(1-methylethyl)benzeneamine], and 1.9 g of 1,3-bis(3-aminopropyl)-1,1,3,3-tetramethyldisiloxane, and these components were then dissolved by adding 235 g of NMP, thus obtaining a solution.

Subsequently, 16.4 g of TAC was added to the above solution while the flask was cooled to ensure that the temperature of the reaction solution did not exceed 20° C. After stirring for one hour at room temperature, 9.4 g of TEA was added while the flask was cooled to ensure that the temperature of the reaction solution did not exceed 20° C., and the reaction was then allowed to proceed for three hours at room temperature, thus producing a polyamic acid solution.

The obtained polyamic acid solution was then further heated at 180° C. for 6 hours, thus producing a polyamideimide resin solution.

This polyamideimide resin varnish was poured into water, and the resulting precipitate was separated, crushed, and dried to obtain a powdered polyamideimide resin (PAI-6). Measurement of the weight average molecular weight (Mw) of the obtained polyamideimide resin (PAI-6) using gel permeation chromatography (GPC) referenced against standard polystyrenes revealed a Mw value of 69,000.

<2> Preparation of Polyamideimide Resin Compositions

In the examples and comparative examples described below, the polyamideimide resin powders (PAI-1) to (PAI-6) produced in the above Synthesis Examples 1 to 6 were each used to prepare a polyamideimide resin composition (a primer varnish for a semiconductor device).

Example 1

A 0.5-liter four-neck flask was charged, under a stream of nitrogen, with 12 g of the polyamideimide resin powder (PAI-1) obtained in Synthesis Example 1, 35 g of N-methyl-2-pyrrolidone, 52 g of butyl cellosolve acetate, and 2 g of a silane coupling agent (product name: KBM-402 (3-glycidoxypropylmethyldimethoxysilane), manufactured by Shin-Etsu Chemical Co., Ltd.), and the resulting mixture was stirred for 12 hours, thus obtaining a yellow reaction mixture. The thus obtained yellow reaction mixture was placed in a filtration device KST-47 (manufactured by Advantec Group), and a pressurized filtration was conducted at a pressure of 0.3 MPa, thus obtaining a semiconductor device primer varnish (P-1).

Example 2

With the exception of replacing the polyamideimide resin powder (PAI-1) used in Example 1 with the powder (PAI-2) obtained in Synthesis Example 2, a semiconductor device primer varnish (P-2) was prepared in exactly the same manner as Example 1.

Example 3

With the exception of replacing the polyamideimide resin powder (PAI-1) used in Example 1 with the powder (PAI-3) obtained in Synthesis Example 3, a semiconductor device primer varnish (P-3) was prepared in exactly the same manner as Example 1.

Comparative Example 1

With the exception of replacing the polyamideimide resin powder (PAI-1) used in Example 1 with the powder (PAI-4) obtained in Synthesis Example 4, a semiconductor device primer varnish (P-4) was prepared in exactly the same manner as Example 1.

Comparative Example 2

With the exception of replacing the polyamideimide resin powder (PAI-1) used in Example 1 with the powder (PAI-5) obtained in Synthesis Example 5, a semiconductor device primer varnish (P-5) was prepared in exactly the same manner as Example 1.

Comparative Example 3

With the exception of replacing the polyamideimide resin powder (PAI-1) used in Example 1 with the powder (PAI-6) obtained in Synthesis Example 6, a semiconductor device primer varnish (P-6) was prepared in exactly the same manner as Example 1.

Comparative Example 4

With the exception of replacing the polyamideimide resin powder (PAI-1) used in Example 1 with a polyetherimide (manufactured by Sigma-Aldrich Corporation), a semiconductor device primer varnish (P-7) was prepared in exactly the same manner as Example 1.

<3> Evaluations of Polyamideimide Resin Compositions (Primer Varnishes for Semiconductor Devices)

Various characteristics were evaluated using the methods described below.

Glass Transition Temperature and Elastic Modulus

Each of the semiconductor device primer varnishes (P-1) to (P-7) obtained in Examples 1 to 3 and Comparative Examples 1 to 4 was applied to a substrate using a bar coater and then dried by heating to obtain a dried film with a thickness of 10 μm. The heated drying used to form the dried film involved heating at 50° C. for 10 minutes, and then conducting drying at 200° C. for one hour.

Using the dried film obtained in this manner as a measurement sample, measurement was conducted in the following manner.

The measurement sample was placed in a dynamic viscoelasticity measurement device (Rheogel-E4000) manufactured by UBM Co., Ltd., and the glass transition temperature of the polyamideimide resin was measured. The measurement was performed under conditions including a chuck separation of 20 mm and a rate of temperature increase of 3° C./min, with the glass transition temperature (Tg) obtained from the position of the tan δ peak. The measured value is shown in Table 1.

Further, using a similar dried film, the elastic modulus was also measured. The measured value obtained at a temperature of 35° C. and a measurement frequency of 10 MHz is shown in Table 1.

Adhesion (Shear Strength)

For each of the semiconductor device primer varnishes (P-1) to (P-7) obtained in Examples 1 to 3 and Comparative Examples 1 to 4, the adhesion was evaluated using a 4000-series shear strength measurement device from ARCTEC, Inc.

Specifically, first, the primer varnish was applied to a Ni substrate using a spray coater (model number: SV91) manufactured by San-Ei Tech Ltd.), and the varnish was then dried by heating to obtain a dried film. The thickness of the dried film was 10 μm.

Next, a resin sealing layer of ϕ5 mm was molded on top of the dried film to produce a measurement sample. An epoxy-based sealing resin (CEL-420HFC) manufactured by Hitachi Chemical Co., Ltd. was used as the sealing material.

The thus obtained measurement sample was set on the heat stage of a 4000-series shear strength measurement device manufactured by ARCTEC, Inc., and the shear strength was measured. Measurements were conducted at temperatures of 25° C., 200° C., 260° C. and 300° C., under conditions including a probe speed of 3 mm/min. The results are shown in Table 1.

Based on the measurement results for the shear strength at 300° C., the adhesion at high temperatures was evaluated against the criteria shown below. The evaluation results are shown in Table 1.

Criteria for Adhesion at High Temperatures

A: shear strength at 300° C. of 8.0 MPa or greater
B: shear strength at 300° C. of at least 5.0 MPa but less than 8.0 MPa
C: shear strength at 300° C. of less than 5.0 MPa.

Reliability Evaluation (Moisture Absorption Reflow Test)

Each of the semiconductor device primer varnishes (P-1) to (P-7) obtained in Examples 1 to 3 and Comparative Examples 1 to 4 was subjected to a moisture absorption reflow test.

Specifically, first, a package was assembled having a Si chip mounted on a Cu lead frame, the primer varnish described above was then applied to the package using a spray coater (model number: SV91) manufactured by San-Ei Tech Ltd., and the varnish was then dried to obtain a dried film. The drying was conducted under conditions including a temperature of 260° C. and a drying period of one hour.

Next, a resin sealing layer was molded on top of the dried film using a product CEL-8240 or CEL-400 manufactured by Hitachi Chemical Co., Ltd. as the sealing material, thus obtaining an evaluation sample.

Subsequently, the obtained evaluation sample was used to conduct a moisture absorption reflow test under the following conditions.

Moisture absorption conditions: JEDEC MSL 2 (85° C./60% RH×168 hours)
Reflow conditions: 260° C./10 seconds×3 repetitions The semiconductor device was inspected before and after the reliability test (moisture absorption reflow test) with a high-precision ultrasonic microscope (C-SAM) to ascertain whether or not and detachment had occurred between the resin sealing layer, the resin dried film (primer layer) and the lead frame. The results are shown in Table 1.

The reliability test evaluation results shown in Table 1 indicate the number of samples in which detachment was confirmed (the numerator) relative to the total number of samples evaluated (the denominator). The inspection conditions were as follows.

Apparatus: high-precision ultrasonic microscope (C-SAM) D9600 manufactured by Sonoscan Corporation, oscillation frequency: 30 MHz Conditions: room temperature (25° C.±5° C.), pure water used

TABLE 1

| | Viscosity (mPa · s) | Tg (° C.) | Elastic modulus (GPa) | Shear strength test (MPa) | | | | | Reliability test | |
| --- | --- | --- | --- | --- | --- | --- | --- | --- | --- | --- |
| | | | | 25° C. | 200° C. | 260° C. | 300° C. | Evaluation | Before test | After test |
| Example 1 | 250 | 330 | 3.3 | 29.0 | 18.2 | 17.1 | 10.0 | A | 0/16 | 0/16 |
| Example 2 | 220 | 320 | 2.7 | 31.6 | 18.5 | 17.0 | 9.1 | A | 0/16 | 4/16 |
| Example 3 | 232 | 302 | 3.1 | 24.4 | 16.8 | 16.4 | 6.3 | B | 0/16 | 10/16 |
| Comparative Example 1 | 200 | 220 | 2.8 | 24.7 | 17.4 | 10.0 | 0.8 | C | 0/16 | 16/16 |
| Comparative Example 2 | 55 | 273 | 3.0 | 24.7 | 21.1 | 11.7 | 1.8 | C | 0/16 | 16/16 |
| Comparative Example 3 | 270 | 280 | 3.3 | 19.7 | 18.7 | 13.7 | 2.0 | C | 0/16 | 15/16 |
| Comparative Example 4 | 180 | 217 | 3.0 | 21.1 | 16.8 | 9.4 | 0.5 | C | 0/16 | 16/16 |

As illustrated above, with the resin compositions of the present invention (Examples 1 to 3), excellent adhesion was able to be achieved even in high-temperature regions exceeding 260° C. Further, favorable results were also obtained in the reliability tests conducted by moisture absorption reflow testing. In contrast, compared with Examples 1 to 3, the resin compositions of Comparative Examples 1 to 4 yielded markedly inferior results for the adhesion at high temperatures and in the moisture absorption reflow test.

Based on these results, it is evident that by incorporating a cardo structure fluorene skeleton according to the present invention, a resin and a resin composition can be provided that exhibit excellent adhesion at high temperatures, and are capable of improving the reliability of semiconductor devices.

DESCRIPTION OF THE REFERENCE SIGNS

1: Lead frame, Cu substrate
1a: Die pad
1b: Lead
2: Semiconductor element
3: Primer layer (resin composition film)
4: Wire
5: Resin sealing layer

The invention claimed is:

1. A polyamideimide resin containing a structural unit (Ia) represented by a formula shown below, and a structural unit (IIa) represented by a formula shown below, and a structural unit (IVa) represented by a formula shown below:

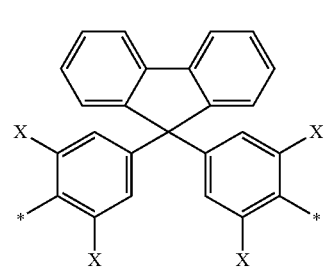

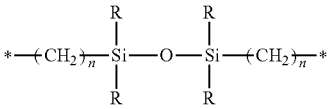

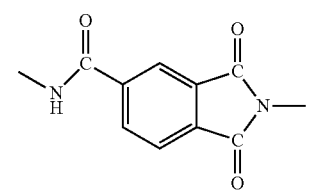

wherein in formula (Ia), each X independently represents a hydrogen atom, or at least one substituent selected from the group consisting of halogen atoms, alkyl groups of 1 to 9 carbon atoms, and alkoxy groups and hydroxyalkyl groups of 1 to 9 carbon atoms, and in formula (IIa), each R independently represents a hydrogen atom or at least one substituent selected from the group consisting of alkyl groups of 1 to 9 carbon atoms, alkoxy groups of 1 to 9 carbon atoms and halogen atoms, and n represents an integer of 1 to 6.

2. The polyamideimide resin according to claim 1, further containing a structural unit (IIIa) represented by a formula shown below:

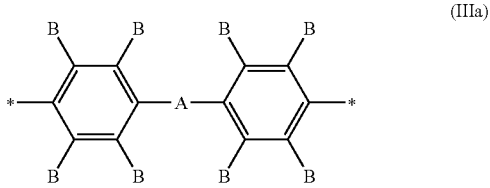
(IIIa)

wherein formula (IIIa), A represents an oxygen atom, a sulfur atom, one group selected from the group consisting of a carbonyl group, sulfonyl group, methylene group, dimethylmethylene group, hexafluoroisopropylidene group, amide group, ester group, diphenyl ketone group, 1,4-phenyleneoxy group, 1,4-biphenyleneoxy group, sulfonyl-bis(1,4-phenyleneoxy) group, isopropylidene-bis(1,4-phenyleneoxy) group and hexafluoroisopropylidene-bis(1,4-phenyleneoxy) group, or a single bond, and each B independently represents a hydrogen atom, or at least one substituent selected from the group consisting of alkyl groups of 1 to 9 carbon atoms, alkoxy groups of 1 to 9 carbon atoms, a trifluoromethyl group, carboxylic acid groups, a hydroxy group, and halogen atoms.

3. A polyamideimide resin composition comprising the polyamideimide resin according to claim 1, and a solvent.

4. The polyamideimide resin composition according to claim 3, further comprising a coupling agent.

5. The polyamideimide resin composition according to claim 3, which, when formed as a film, has an elastic modulus at 35° C. within a range from 0.5 GPa to 3.5 GPa.

6. A semiconductor device comprising a substrate, and a film formed using the polyamideimide resin composition according to claim 3.

7. The semiconductor device according to claim 6, further comprising a resin sealing layer.

8. The polyamideimide resin according to claim 1, having a glass transition temperature of 300° C. or higher.

* * * * *